(12) United States Patent
Al-Shamma et al.

(10) Patent No.: US 6,307,787 B1
(45) Date of Patent: Oct. 23, 2001

(54) BURST READ INCORPORATING OUTPUT BASED REDUNDANCY

(75) Inventors: Ali K. Al-Shamma, San Jose; Takao Akaogi, Cupertino, both of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/724,669

(22) Filed: Nov. 28, 2000

Related U.S. Application Data
(60) Provisional application No. 60/220,690, filed on Jul. 25, 2000.

(51) Int. Cl.[7] .............................. G11C 16/04; G11C 7/00
(52) U.S. Cl. ...................................... 365/185.33; 365/200
(58) Field of Search ......................... 365/185.33, 185.23, 365/200, 230.02, 230.06, 189.02, 49

(56) References Cited

U.S. PATENT DOCUMENTS

| | | | |
|---|---|---|---|
| 5,347,484 | * 9/1994 | Kwong et al. | 365/49 |
| 5,438,546 | * 8/1995 | Ishac et al. | 365/200 |
| 5,502,676 | * 3/1996 | Pelley, III. et al. | 365/200 |
| 5,574,688 | * 11/1996 | McClure et al. | 365/200 |
| 5,774,396 | * 6/1998 | Lee et al. | 365/185.09 |
| 5,999,450 | * 12/1999 | Dallabora et al. | 365/185.09 |

* cited by examiner

Primary Examiner—Amir Zarabian
Assistant Examiner—Anh Phung

(57) ABSTRACT

A device for performing redundant reading in a flash memory is provided. The device includes arrays of regular memory cells and arrays of redundant memory cells. Some of the regular memory cells may be defective and those will have defective addresses. A regular sense amplifier will read the regular memory cells at their accessed address while at a time no later a redundant sense amplifier will read the redundant memory cells. A first array of CAM's will store the defective addresses of the defective memory cells while a second array of CAM's will store the input/output designators of the defective memory cells. Address matching circuitry will compare the accessed addresses with the defective addresses to determine whether the accessed address is defective. Before the end of the reading intervals of the sense amplifiers, decoding circuitry will decode the input/output designators of both the defective and non-defective memory cells. A multi-bit multiplexer stage will output either the contents of the regular memory cell or, if the address is defective, the contents of the redundant memory cell. The contents will be applied to the multiplexer output corresponding to the input/output designator of the memory cell.

11 Claims, 11 Drawing Sheets

BURST READ INCORPORATING OUTPUT BASED REDUNDANCY

This application claims benefet of provisional application serial No. 60/220,690 filed Jul. 25, 2000.

BACKGROUND OF THE INVENTION

The present invention relates generally to semiconductor memory devices. More particularly, the present invention relates to output based redundancy in a flash memory. Flash random access memory (RAM), more commonly known as flash memory, is a form of non-volatile storage that uses a memory cell design with a floating gate. High voltages are applied to the memory cell inputs to program or store charge on the floating gate or to erase or remove charge from the floating gate. Programming occurs by hot electron transfer to place charge on the floating gate while erasure makes use of Fowler-Nordheim tunneling in which electrons pierce a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Newer technologies, such as simultaneous read and write operation flash memories, present opportunities for the redesign of CAM circuitries and architectures and their associated output circuitry to meet increasing standards of system performance, and device density. It would be desirable to implement a more efficient redundancy CAM circuitry and architecture and associated output circuitry.

Redundant core cell arrays are utilized to substitute for inoperative or defective memory core cells of primary or regular arrays. Content addressable memory (CAM) circuitry may be utilized to assist in redundancy substitution. Redundancy CAM cells store information regarding the locations of inoperative or defective memory cells so that redundant arrays of memory cells may be used to substitute for the inoperative or defective memory cells of the primary arrays.

Typically, the arrays of memory cells are tested by the manufacturer for performance and accuracy prior to utilization by a customer or user. The redundancy CAM cells are erased and programmed with the locations of inoperative memory cells as appropriate following the testing stage.

Core cells in memory may be byte or word addressable. If a particular operation is to be performed at a primary array, an address for the operation is supplied. At present, before the memory cell location for the primary array is accessed, the address is compared with address information relating to the location of the inoperative memory cells. If the address matches a location of a group of inoperative memory cells, the address is redirected to the redundant array. The operation is then performed at the redundant array. If the address does not match a location of a group of inoperative memory cells, the address is applied to the primary array, and the operation is performed at the primary array. Typically, this substitution of primary array memory cells with redundant array memory cells is seamless and transparent to the user of the memory.

Newer technologies, such as simultaneous read and write operation flash memories, present opportunities for the redesign of CAM circuitries and architectures and their associated output circuitry to meet increasing standards of system performance, and device density. The presently preferred embodiments described herein implement a more efficient redundancy CAM circuitry and architecture and associated output circuitry in a memory such as a flash memory.

A CAM cell is configured to store information regarding a location of an inoperative memory cell in a primary core cell array. Typically, the inoperative memory cell requires a substitution with a memory cell in a redundant array. The information stored in the CAM cell may relate to whether a memory cell, as addressed by an operation address of the primary core cell array requires a substitution with a memory cell of a redundant array.

Referring now to FIG. 1, it is a block diagram of a memory 100 according to a presently preferred embodiment. In the illustrated embodiment, the memory 100 is configured as a flash memory formed as a complementary metal-oxide-semiconductor (CMOS) integrated circuit for storing digital data. However, the memory 100 may take any other suitable form and in fact the principles described herein may be applied in any other suitable circuit in which simultaneous operation permits a dual-ported CAM architecture. The memory 100 includes a core cell array 102, a decoder 104, address buffer circuitry 108, redundancy CAM circuitry 106, a control logic circuit 110, and sense amplifier and output circuitry 112. The control logic circuit 110 is coupled to the decoder 104, the address buffer circuitry 108, and the sense amplifier and output circuitry 112. The control logic circuit 110 produces a series of read and write select operation signals RSEL, WSEL and distributes the signals to the decoder 104 and the redundancy CAM circuitry 106. Preferably, the control logic circuit 110 distributes timing and other control signals for the memory 100.

The core cell array 102 includes a plurality of memory cells, each configured to store data. In some applications, each memory cell may store a single bit of data; in other applications, each memory cell may store two or more bits of data. The memory cells of the core cell array 102 may be byte or word addressable and are accessed by a corresponding address at the address buffer circuitry 108. In one embodiment, the memory cells are accessed as data words, and the addresses correspond to unique data words. However, as will be apparent to one of skill in the art, other embodiments are possible where each memory cell has a unique address, which is decoded by the decoder 104.

The decoder 104 typically includes row or x-address decoding logic and bit line or y-address decoding logic. The x-address decoding logic of the decoder 104 responds to an address signal ADD provided from the address buffer circuitry 108 by activating one word line of a plurality of word lines, each word line being associated with one row of the core cell array 102. In response to activation of the word line, memory cells associated with that word line turn on and begin sinking current. To adequately turn on the memory cells, the word line must be varied by a substantial potential difference, such as 3.0 to 4.0 V, for example.

The y-address decoding logic of the decoder 104 couples the appropriate bit line of the core cell array 102 to the sense amplifier and output circuitry 112. The y-address decoding logic responds to an address ADD from the address buffer circuitry 108 to decode the selected bit line from among a plurality of bit lines of the core cell array 102. The sense amplifier and output circuitry 112 senses the current in the selected memory cell of the core cell array 102 and determines the binary state of the one or more bits of data stored in the selected memory cell. The circuitry 112 produces the memory cell data that are sensed, in one embodiment, as data words by the sense amplifier circuitry 112 at the output of the memory 100 for use external to the memory 100. Other circuitry, not shown in FIG. 1, provides for programming, reading, verifying, erasing, and performing other operations as necessary on the individual memory cells of the core cell array 102.

The memory 100 operates in response to a supply voltage, labeled $V_{cc}$ in FIG. 1. The potential difference between $V_{cc}$ and ground is the supply voltage and may be in the range 0.8 to 3.3 volts, for example. The suitability of the supply voltage $V_{cc}$ will depend on a variety of factors, including the technology with which the memory 100 is fabricated. In general, in advanced CMOS processes, the supply voltage will nominally be 1.8 volts. In absolute terms, this voltage is greater than the magnitude of the turn-on, or threshold, voltage $V_{tp}$ for p-channel transistors of −0.9 volts and the turn-on or threshold voltage $V_{tn}$ for n-channel transistors of +1.0 volts.

The core cell array 102 typically includes a series of primary arrays and redundant arrays. The redundancy CAM circuitry 106 of FIG. 1 further includes CAM cells that store information regarding the location of an inoperative or defective memory cell or of an inoperative or defective bit line of one of the primary arrays of the core cell array 102. A bit line of an associated redundant array is used as a substitute for an inoperative bit line. The CAM cells of the redundancy CAM circuitry 106 are programmed and erased at the PROG/ERASE input shown in FIG. 1. Typically, the CAM cells are programmed and erased during a testing stage that takes place prior to use of the chip by an end-user or customer.

Whenever an operation such as a read or write is performed at the core cell array 102, the operation address is applied to the redundancy CAM circuitry 106 to compare the operation address with the information stored in the CAM cells. If the operation address matches the location information stored in the CAM cells, then at least one of the memory cells locations to which the operation address refers is inoperative and requires a redundancy substitution.

For example, if a read operation is performed from the regular array, a read address that corresponds to a series of memory cells making up a data word is compared with the information in the redundancy CAM cells. If an inoperative bit line happens to include one of the series of memory cells that the read address would access with no redundancy substitution, then the redundancy CAM circuitry will indicate a read match for the read address. Decoding logic ensures that a bit line of the redundant array is substituted for the inoperative bit line and the inoperative memory cell that the read address would access with no redundancy substitution. A similar substitution would occur if an inoperative bit line happens to include one of the series of memory cells that the write address would access with no redundancy substitution.

FIG. 2 is a diagram illustrating an exemplary core cell array 102 including primary arrays and redundant arrays according to the memory 100 of FIG. 1. Horizontally, the exemplary core cell array 102 of FIG. 2 is divided into an upper bank 114 and a lower bank 116. Vertically, the array 102 is divided into four vertical arrays VERT0, VERT1, VERT2, VERT3, each vertical array including a primary array and an associated redundant array. The upper bank 114 includes upper primary arrays 118A–D and upper redundant arrays 120 A–B. The lower bank 116 includes lower primary arrays 128 A–D and lower redundant arrays 130 A–D. The vertical array VERT0, for example, includes the primary arrays 118A, 128A and the redundant arrays 120A, 130A.

In one embodiment, each vertical array is divided into nine sectors of memory cells (not shown in FIG. 2). Horizontally, each sector is divided into a series of column areas within the primary array. Each column area, in turn, includes a number of memory cells. Each memory cell of the column area preferably corresponds to a unique bit line for the primary array. As discussed above, in the event of an inoperative memory cell in the primary arrays, the location of the inoperative memory cell is identified. Typically, a bit line spanning the upper and lower redundant array portions of the vertical array substitutes for the entire bit line of the primary array that corresponds to the inoperative memory cell. If one memory cell of a bit line is inoperative, the entire bit line will be substituted for by a redundant bit line, so that an inoperative bit line by definition includes at least one inoperative memory cell. Typically, and depending on the design of the core cell array 102, a limited number of inoperative bit lines of a primary array may be substituted for with an associated redundant array.

In one embodiment as described above, the memory cells are accessed as data words, with a column area of memory cells storing a unique data word. For example, a read operation is performed where two 16 bit data words are read at a time internally while one 16 bit data word is produced at a time from the output circuitry 112. In this way, two column areas would be accessed together in a read operation. By contrast, a write operation is performed with one 16 bit data word at a time, and one column area would be accessed at a time. Of course, these data word lengths are exemplary and other word lengths may be used as suitable.

FIG. 3 is a circuit diagram of an exemplary CAM stage 200 and accompanying output circuitry according to the memory of FIG. 1. The exemplary CAM stage 200 includes a CAM cell 202, a write data bus 204, and a read data bus 206. The CAM cell 202 is a transistor, preferably an n-channel metal-oxide-semiconductor field effect transistor (MOSFET). While the CAM cell 202 is preferably a MOSFET transistor utilized as a nonvolatile memory cell, any suitable active data storage element may be used for the CAM cell 202. The write data bus 204 has an output port coupled to a node 212 and an input coupled to the drain of the CAM cell 202 at a node 216. The read data bus 206 has an output port coupled to a node 214 and an input coupled to the drain of the CAM cell 202 at the node 216. The write data bus 204 and the read data bus 206 are transistors, typically n-channel MOSFETs. Of course, any suitable data bus may be used for the data buses 204, 206. A write select signal WSELm is applied to the gate of the write data bus 204, while a read select signal RSELm is applied to the gate of the read data bus 206. A voltage $V_G$ is applied to the gate input of the CAM cell 202, while a voltage $V_s$ is applied to the source input of the CAM cell 202. In one embodiment, during regular operation of the CAM cell 202, such as when the CAM cell 202 is checked or accessed, the voltage $V_s$ will be at ground potential.

A shorthand designation for the exemplary dual-ported CAM stage 200 is also presented in FIG. 3. A generic CAM stage 200 can be referred to as CAMn/ VERTm, where m refers to any one of M vertical arrays VERT0–VERTM, where n refers to any one of N CAM stages 200 CAM0–CAMN associated with a vertical array VERTm. In the exemplary core cell array 102 shown in FIG. 2, there are M=4 vertical arrays VERT0-VERT3.

In one embodiment each vertical array VERTm has N=8 associated and unique redundancy CAM stages CAM0–CAM7. In another embodiment each vertical array VERTm has N=16 associated and unique redundancy CAM stages CAM0–CAM16, arranged in one or two separate columns. Of course, the core cell array 102 is scalable and may be designed, sized, arranged, or separated differently from the exemplary core cell array 102 shown in FIG. 2. The number of redundancy CAM cells 202 and stages 200 associated with each vertical may also vary depending on the embodiment and the particular design and layout of the core cell array 102. That is, more redundancy arrays may be provided or additional CAM cells may be used to particularly identify the location of an inoperative or defective memory cell, the location of the inoperative bit line that includes the inoperative memory cell, or the column area in which the inoperative bit line is located.

In one embodiment, the CAM cell 202 is a non-volatile memory cell that is capable of being erased of information or of being programmed with information. If the CAM cell 202 is an n-channel MOSFET transistor, this is accomplished via modification of the threshold voltage of the transistor. The signal cell program/erase and the accompanying arrow are intended to indicate the program/erase operation performed on the CAM cell 202. The CAM cell 202 will respond differently to an applied gate voltage depending on whether the CAM cell 202 is programmed or erased.

When the CAM cell 202 is programmed, regulated voltages are typically applied to the drain and the gate of the transistor cell 202. The regulated voltages are relatively high, compared with the supply voltage $V_{cc}$.

For example, a voltage $V_D$ of approximately 5.0 volts is applied to the drain, while a voltage $V_G$ of around 8.5 volts is applied to the gate input of transistor CAM cell 202. Regardless of the voltages utilized, the combined effect of the programming operation on the CAM cell 202 is to increase the threshold voltage higher than any applied voltage at the gate of the CAM cell 202 during regular operation of the redundancy CAM circuitry 106, that is, higher than the supply voltage $V_{cc}$.

During regular operation, once the CAM cell 202 is programmed and the drain of the cell 202 is at ground potential, when a gate voltage $V_G$, preferably the supply voltage $V_{cc}$, is applied nothing will happen, i.e. the CAM cell will not turn on or conduct.

Typically, all of the CAMs are preprogrammed prior to erasure, and are erased together. The CAM cells 202 may be erased with an ultra-violet erase procedure as is known to those skilled in the art. Of course, other erase techniques may be used. The effect of the erase operation on the CAM cell 202 is to lower the threshold voltage from its value when the cell 202 is programmed to a regular value consistent with a regular transistor. Typically, when the CAM cell 202 is erased, the threshold voltage is set so that the cell 202 will behave like an n-channel transistor, i.e., when a gate voltage $V_G$ equivalent to the supply voltage $V_{cc}$ is applied, the transistor will turn on and conduct.

Also illustrated in FIG. 3 are two p-channel bias transistors 208, 210 utilized as accompanying output circuitry for the exemplary CAM stage 200. The transistors 208, 210 are designed and sized as weak pull-up transistors relative to the CAM cell 202. The p-channel transistors 208, 210 in one embodiment are low threshold voltage transistors in FIG. 3.

It is well known to those skilled in the art that the threshold voltages of transistors such as MOSFETs are controlled during fabrication. The device fabrication process allows some flexibility in selecting the threshold voltage. However, normal values prevail and are in common usage for MOSFETs in particular processes. It should be understood that these threshold voltages are exemplary only. Generally, transistor design parameters, such as threshold voltages and device sizes, other circuit configurations, or other applicable design techniques available to those skilled in the art may be used or substituted where suitable.

The p-channel transistors 208, 210 are coupled to the write and read data buses 204, 206. For example, the read p-channel bias transistor 210 is coupled to the output port of the read data bus 206 at node 214. The generic CAM stage 200, which may be referred to as CAMnNERTm, and the read p-channel bias transistor 210 produce a signal CAMnR at node 214, where, as above, n refers to any one of n CAM stages 200CAMn associated with a vertical array VERTm. The R identifies the signal CAMnR at node 214 as a read operation CAM signal. In the light of the immediately foregoing, the function of the write p-channel bias transistor 208 and its write data bus 204 will be apparent to those of skill in the art.

The gate inputs of the read and the write p-channel bias transistors 210, 208 are connected to ground potential, while the source inputs are at the supply voltage VCC. Therefore, since the transistors 210, 208 are low threshold voltage transistors as described above, the transistors 210, 208 will conduct and the respective nodes 212, 214 will be at $V_{cc}$ in the absence of pull-down action from the CAM stage 200.

The operation of the CAM stage 200 in conjunction with the transistors 208, 210 proceeds as follows. In one embodiment, whenever an operation to access the core cell array 102 occurs, regardless of whether the operation is a read or a write, the CAM cells 202 of the redundancy CAM circuitry 106 are accessed. A determination is made whether the address in question (a read address or a write address) includes an inoperative memory cell location where a redundancy substitution is needed. The information regarding this location was programmed into the CAM cells 202 typically prior to the operation. Whenever a read or write operation or both occurs, the source voltage $V_s$ of every CAM cell 202 is at ground potential and the gate voltage $V_G$ of every CAM cell 202 is brought up to the supply voltage $V_{cc}$.

If a read operation is performed at a vertical array VERTm, the read select signal RSELm will be high and the read data bus 206 will be on. A programmed CAM cell 202 will remain off and will not turn on or conduct in response to an applied gate voltage $V_G$, in one embodiment the supply voltage $V_{cc}$. The read pull-up transistor 210 will conduct and the node 214 will be at $V_{cc}$ in the absence of pull-down action from the CAM stage 200. Therefore, if the CAM cell 202 is programmed and the read data bus 206 is on, the node 214 remains high or at $V_{cc}$.

If a read operation is being performed at a vertical array VERTm, then the read select signal RSELm will be high and the read data bus 206 will be on. An erased CAM cell 202 will behave like an n-channel transistor and will turn on and conduct in response to an applied gate voltage $V_G$, in one embodiment the supply voltage $V_{cc}$. The CAM cell 202 will pull the node 216 to ground potential. Typically, the CAM cell 202 is designed to be stronger than the read pull-up transistor 210 and therefore, if the CAM cell 202 is erased and the read data bus 204 is on, the node 214 will be pulled to ground potential.

If a read operation is not being performed at a vertical array VERTm, the read data bus 206 will be off and the CAM cell 202 will not be checked. Whether the CAM cell 202 is programmed or erased will not affect the value of the signal CAMnR at the node 214.

Generally, if a read operation is being performed at a vertical array VERTm, the signals CAM0R . . . CAMnR will specify the location of the bit line where a redundancy substitution is to be made, if one exists and one was programmed in the CAM stages 200 CAM0/VERTm . . . CAMn/VERTm. Preferably, one or more of the signals CAM0R . . . CAMnR will be compared with the read address to determine whether there is a read match. If there is a read match for an inoperative or defective bit line, a bit line from the redundant array substitutes for the inoperative bit line. That is, the redundant bit line is utilized instead of the inoperative bit line if a match is indicated between the read address and the CAM stages 200 associated with the primary array at which the read operation otherwise occurs.

FIG. 4 is a block diagram illustrating an exemplary CAM stage array 300 and accompanying output circuitry according to the memory of FIG. 1 and the exemplary core cell array 102 of FIG. 2. The redundancy CAM circuitry 106 of FIG. 1 includes the exemplary CAM stage array 300. The CAM stage array 300 includes the following CAM stages 200 associated with the vertical array VERT0: CAM0/VERT0 302A . . . CAM7/VERT0 302H. Similar CAM stages 200 are associated with the other vertical arrays VERT1–VERT3.

The CAM stage array 300 further includes read p-channel pull-up low-threshold voltage transistors 370A-H and write p-channel pull-up low threshold voltage transistors 380A-H.

All of the CAM stages 200 of the CAM stage array 300 associated with the vertical array VERT0 receive the write and read select signals WSEL0, RSEL0. All of the CAM stages 200 of the CAM stage arrays 300 associated with the other vertical arrays receive similar write and read select signals.

The CAM stages CAM0/VERT0 302A–CAM0/VERT3 305 A are all coupled to the read pull-up transistor 370 A at a shared output having a signal CAM0R and are all coupled to the write pull-up transistor 380 A at a shared output having a signal CAM0W.

The CAM stages on other horizontal lines are all coupled to read pullup transistors at shared outputs CAM1R–CAM7R and are all coupled to similar write pull-up transistors at shared outputs CAM1W–CAM7W.

FIG. 5 is a block diagram illustrating an exemplary group 400 of CAM stages 200 associated with one vertical array VERTm of the exemplary core cell array 102 of FIG. 2. The exemplary CAM stage group 400 includes the following CAM stages 200: CAM0/VERTm 402A . . . CAM7 NERTm 402H, all associated with a vertical array VERTm. All of the CAM stages 200 of the CAM stage group 400 receive a write select signal WSELm and a read select signal RSELm corresponding to the vertical array VERTm.

In addition, in one embodiment, the memory cells are accessed as data words, with a column area of memory cells storing a unique data word. For example, a read operation is performed where two 16 bit data words are read at a time internally while one 16 bit data word is produced at a time from the output circuitry 112 of FIG. 1. In this way, two column areas would be accessed together in a read operation. By contrast, a write operation is performed with one 16 bit data word at a time, and one column area would be accessed at a time. Of course, these data word lengths are exemplary and other word lengths may be used as suitable.

According to one embodiment, a horizontal row in the primary array of a vertical array VERTm will include p column areas, each including q bit lines. For example, the row may include p=16 column areas with each of the 16 column areas including q=16 bit lines, for a total of 256 bit lines in a horizontal row. Of course, these values are exemplary and intended to explain rather than limit the described embodiments.

The exemplary CAM stage group 400 of eight CAM stages 402A–402H specifies the location of an inoperative bit line with a column area of the primary array of the vertical array VERTm. A redundant bit line of the redundant array substitutes for the inoperative bit line that would otherwise be accessed by a write or read operation.

The location of an inoperative bit line $BL_i$ is identified first by identifying the column area of the p column areas that includes the inoperative bit line. Next, the bit line of the q bit lines of the column area that corresponds to the inoperative bit line is identified. Accordingly, the exemplary CAM stage group 400 of eight CAM stages 402A–402H stores two pieces of information to indicate the location of the inoperative bit line $BL_i$.

For a read operation, the h-bit ($2^h$=p/2) read address that corresponds to two column areas, having a total of 2 q bit lines, is compared to the h-bit ($2^h$=p/2) address stored in a group of h address CAM stages. The two column areas in this embodiment store two data words. In particular, the h address CAM stages specify the h-bit ($2^h$=p/2) address of the two column areas, one of which includes the inoperative bit line $BL_i$. If there is a match between the h-bit read address and the h-bit address stored in the h address CAM stages, then the location of the inoperative bit line $BL_i$ is identified by j ($2^j$=2q) I/O CAM stages. The values for h and j will in general depend on the values for p and q.

For example, according to a read operation in one embodiment, two 16 bit data words are read at a time internally while one 16 bit data word is produced at a time from the output circuitry 112 of FIG. 1. In this way, two of the p=16 column areas, each column area including q=16 bit lines, are accessed at a time. According to FIG. 5, h=3 ($2^3$=8) address CAM stages 402 F, G, H store the 3-bit address of two column areas, one of which includes an inoperative bit line $BL_i$, and j=5 ($2^5$=32) I/O CAM stages 402A–402E store the location of the inoperative bit line $BL_i$ of the 32 bit lines within two column areas. When a read operation is performed the read address is compared against the read address CAM signals READADD0, READADD1, and READADD2 of the address CAM stages CAM5/VERTm 402F, CAM6/VERTm 402G, and CAM7/VERTm 402H, respectively (with address matching circuitry not illustrated in FIG. 5 or FIG. 1.). If the read address and the read address CAM signals match, the I/O CAM stages 402A–402E indicate which bit line of the 32 lines of the two column areas is the inoperative bit line $BL_i$.

The CAM stages together provide the information regarding the location of the inoperative bit line in a primary array that requires a substitution with a bit line in a redundant array. For example, referring to FIG. 5, assume that the output of the CAM stages 402A–402H is 00010001 respectively.

If a read operation is to be performed at the two column areas together having a read address of 000, then these three bits are compared with the following signals:

READADD2=CAM7R=0 from (address) CAM stage 402H;

READADD1=CAM6R=0 from (address) CAM stage 402 G; and

READADD0=CAM5R=0 from (address) CAM stage 402F. There is a read address match, so the contents of the I/O CAM stages are checked to determine the location of the inoperative bit line $BL_i$ within the two column areas together having an address of 000, as shown by the following signals:

READIO4=CAM4R=1 from (I/O) CAM stage 402 E;
READIO3=CAM3R=0 from (I/O) CAM stage 402 D;
READIO2=CAM2R=0 from (I/O) CAM stage 402 C;
READIO1=CAM1R=0 from (I/O) CAM stage 402 B; and
READIO0=CAM0R=1 from (I/O) CAM stage 402A.

In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with different memory densities and alternate interface implementations with their accompanying alternate address and control input configurations.

The simultaneous operation flash memory can be operated in a burst mode. In a burst read mode a plurality of bits of data are read at one time and appear at the memory outputs in one or more portions. For example, in one embodiment 32 bits of data are read at one time and appear at the memory outputs in two 16 bit portions. The bursting occurs in very short intervals, e.g. 20 ns. This short interval leaves very little time for a determination from the redundancy CAMS of whether a redundancy read is necessary. Again, after this determination, very little time is available for the identification of the bit line which is inoperative or defective and requires substitution by a redundant bit or column. When that determination is undertaken and indicates that a redundancy read is necessary, and when that bit line identification is undertaken, access to the redundant array and its reading and substitution for defective bit lines prior to the burst output will delay the burst output and slow the performance of the memory device. Accordingly, improvements in the ordering of events during redundant operation would be useful to obtain timing advantages in burst read operation As used herein, various terms and phrases have significance as follows. The term address is intended broadly to refer to any location identifier that uniquely corresponds to, or to the location of, one or more memory cells. The terms and phrases low, logic low, not asserted, not active, and inactive are intended broadly to refer to logic low values of a digital signal, generally understood to represent a binary zero (0). The terms and phrases high, logic high, asserted, and active are intended broadly to refer to logic high values of a digital signal, generally understood to represent a binary one (1). The phrase "A coupled with B" is defined to mean A directly connected to B, or A indirectly connected with B through one or more intermediate components. The term user is intended to refer to a processor or other component or entity seeking access to memory. The term signal refers broadly to an analog or digital signal and encompasses both types of signals.

As used herein, the term inoperative or defective, when used in conjunction with a storage element or a group of storage elements, refers broadly to any condition or state that may require the substitution of one more storage elements for the inoperative storage element. The storage element may include one or more memory cells, or bit lines, or interface circuitry to memory cells, for example. In particular, as used herein, an inoperative or defective memory cell refers broadly to a memory cell with or without accompanying circuitry, such as a bit line that is coupled to the memory cell, or a bit line that includes the memory cell. Typically, a lack of functionality of the storage element will require a substitution for the storage element. The lack of functionality may be due to damage or to a defect in the storage element or in an interface to the storage element.

The steps of the methods recited herein can be performed in any order consistent with the recited acts.

While particular embodiments of the present invention have been and will be shown and described, modifications may be made. For example, the senses of the individual transistors, p-channel and n-channel, may be reversed in suitable applications. It is to be noted that suitable transistor sizes specifying channel width to length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment. Further, the inventive concepts described herein may be applied to circuits other than memory devices.

BRIEF SUMMARY OF THE INVENTION

In view of the above, a device for, and method of, performing redundant reading in a flash memory device is provided.

A first aspect of the present invention is directed towards a device for performing that redundant reading. The device includes an array of memory cells which can be regular memory cells or redundant memory cells. The regular memory cells in turn are defective or non-defective and each has a storage address and an input/output designator. A defective address is the storage address of a defective memory cell.

The device also includes decoding circuitry that generates a defect decoding signal in response to the input/output designator of a memory cell if that cell's address is defective. That circuitry also generates a regular decoding signal if that cell's address is not defective, and that signal corresponds to the input/output designator of that cell. The device also includes a multiplexer stage that outputs a regular signal in response to a regular memory cell and to the regular decoding signal corresponding to the input/output designator of the regular memory cell. That regular signal is applied to the multiplexer output corresponding to the input/output designator of the regular memory cell. That circuit also outputs a redundant signal in response to the redundant memory cell and to the defect decoding signal corresponding to the input/output designator of the defective memory cell. That redundant signal is applied to the multiplexer output corresponding to the input/output designator of the defective memory cell.

In addition, the device for performing redundant reading may also include a first array of one or more CAM's configured to store the defective address, as well as a second array of one or more CAM's configured to store the input/output designator of the defective memory cell.

The device may also include a regular sense amplifier that reads the regular memory cell during a first interval of time and generates the regular signal during it. In such event, the device would also include the redundant sense amplifier that reads the redundant memory cell during a second interval of time and generates the redundant signal during it. The second interval would not extend substantially beyond the first interval.

If the device includes the regular sense amplifier, the decoding circuitry will function during a fourth interval of time that will not extend substantially beyond the first interval.

Along with these sense amplifiers, the device could also include address matching circuitry that compares the regular memory cell's address with the defective address, and generates during a third interval of time a defective address match signal if the comparison determines that the address is defective. That circuitry will also generate during that third interval a nondefective address match signal if the comparison determines that the address is not defective. The third interval would not extend substantially beyond the first interval.

If the device includes the address matching circuitry, the functions of the decoding circuitry dependent upon whether the memory cell's address is defective or not are performed by the address matching circuitry.

Similarly, in the event that device includes the two kinds of sense amplifiers, the regular sense amplifier will communicate the data from the regular memory cell to the multiplexer stage. On the other hand, the redundant sense amplifier will communicate the data from the redundant memory cell to the multiplexer stage.

It is therefore a primary advantage that the redundant sense amplifier will operate during a time interval generally coincident with the time interval during which the regular sense amplifier will operate. As a result the operation of the memory device will not be delayed for operation of the redundant sense amplifier.

It is a further advantage that the address matching circuitry will operate during a time interval generally coincident with the time interval during which the regular sense amplifier will operate. As a result the operation of the memory device will not be delayed for operation of the address matching circuitry.

It is a further advantage that the decoding circuitry will operate during a time interval generally coincident with the time interval during which the regular sense amplifier will operate. As a result the operation of the memory device will not be delayed for operation of the decoding circuitry.

It is a further advantage of the present invention that as a result the amount of area occupied by the X-decoding and related circuitry will be reduced.

Finally, the major objective of enhancing the speed of operation of the memory device will be enhanced by the present invention.

The following figures and detailed description of the preferred embodiments will more clearly demonstrate these and other objects and advantages of the invention.

DETAILED DESCRIPTION OF THE PRESENTLY PREFERRED EMBODIMENTS OF THE INVENTION

Figure 6:
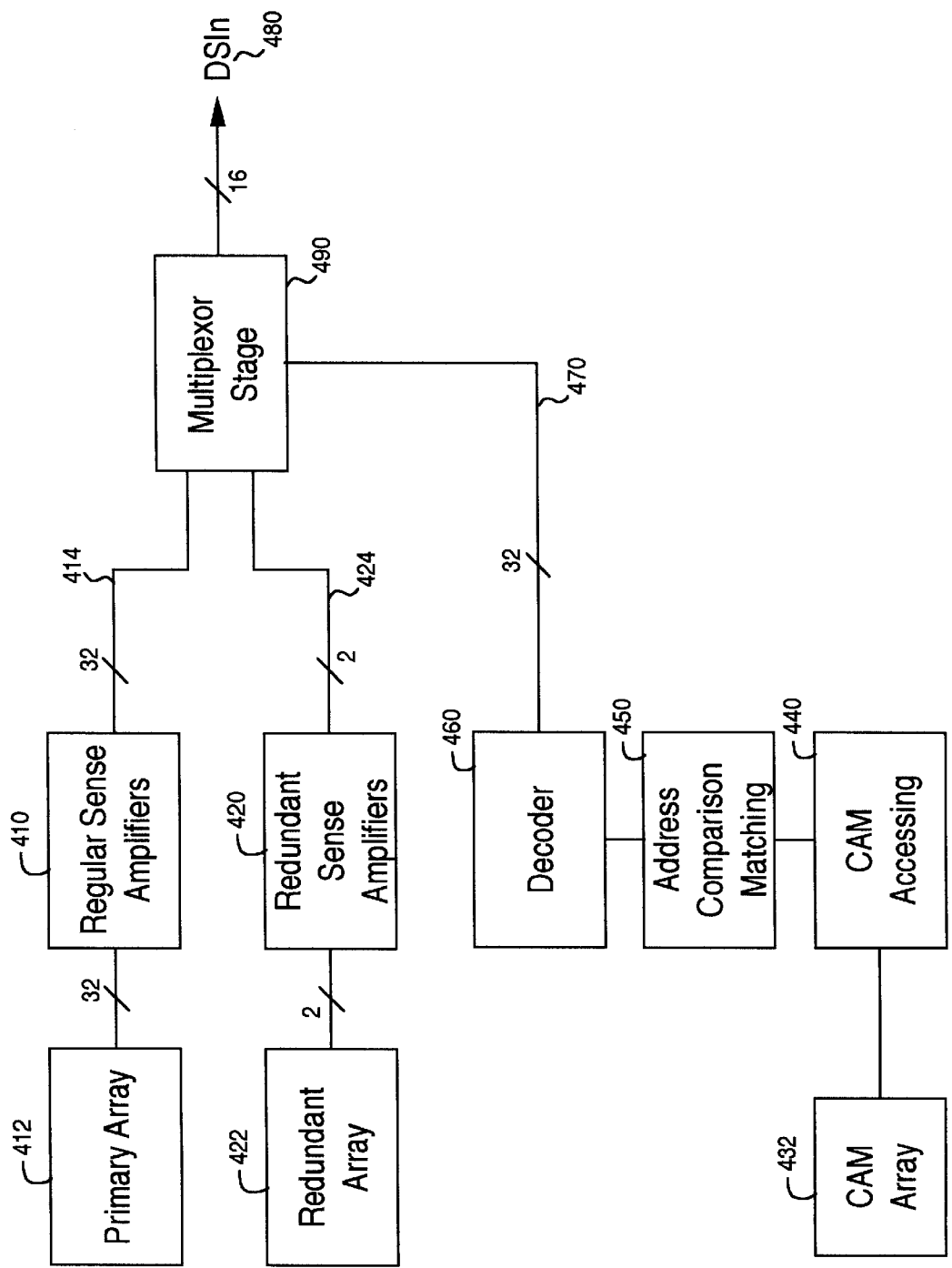
FIG. 6 is a block diagram of one embodiment of the invention.

In one embodiment of the present invention depicted in FIG. 6 sense amplifiers 410 read the memory cells, i.e., regular memory cells, in the primary array 412. For example, in one burst read embodiment 32 s of data are read at one time and appear at the memory outputs 480 in two successive 16 bit portions. In this embodiment 32 sense amplifiers 410 read the regular memory cells. Similarly, sense amplifiers 420 read the memory cells, i.e., redundant memory cells, in the associated redundant array 422. The selection of the actual design of the sense amplifiers will depend on overall memory circuit requirements and will be apparent to those of skill in the art. For convenience, and not necessarily due to inherent difference, the memory cells in the primary array 412 and redundant array 422 are referred to as regular memory cells and redundant memory cells, respectively. For similar reasons, the sense amplifiers 410 are referred to as regular sense amplifiers and redundant sense amplifiers 420, respectively. As described above, two column areas or words of memory cells, each of 16 bits, are accessed at once during a read operation and, accordingly, the bit line bus 414 from the regular sense amplifier block 410 is 32 bits wide and 32 regular sense amplifiers are represented by diagram block 410.

In the most preferred embodiment there are actually two redundant arrays 422 for each primary array 412. Corresponding to the two redundant arrays are two redundant sense amplifiers 420. Corresponding to the two redundant arrays also are two separate arrays 432 of CAM stages, each of which stores the address of a defective two word segment. This doubling of redundancy permits the substitution of redundant memory cells for defective memory cells in two different two word segments within the primary array 412 because each of the two CAM arrays 432 can store a different defective two word address. In the most preferred embodiment this doubling allows for substitution in two different locations in the same two word segment. The two bit-wide bus 424 carries the output signals from the two redundant sense amplifiers 420. In the present embodiment, the two redundant sense amplifiers 420 separately complete the readings of the two redundant memory cells no later, substantially, than the completion of the read operation by the regular sense amplifier 410.

As described above, an array of CAM stages 432 will be associated with each primary array 412. As described above, and as utilized in the present embodiment, this array of CAM stages 432 is accessed, during a reading from that primary array 412, to determine whether a two-word segment being read from the primary array needs a substituted memory cell. The accessing of this array of CAM stages 432 is depicted in block 440 of FIG. 6. Those CAM stages 432 will contain two forms of information. First they will contain the address of a two word segment. The two word segment whose address is contained in the CAM stages 432 will be defective, i.e., will contain a defective bit. Secondly, the CAM stages 432 will store the location of the defective memory cell or bit line within that two word segment.

The terminology for this location can assume special form for a burst read memory. Because 16 bits (i.e., one word of a two word segment) are placed on the multiple input/output connections 480 of the memory at once, the bit location within those 16 bits is referred to herein as "input/output designator" and will range from 0 to 15.

Figure 1:
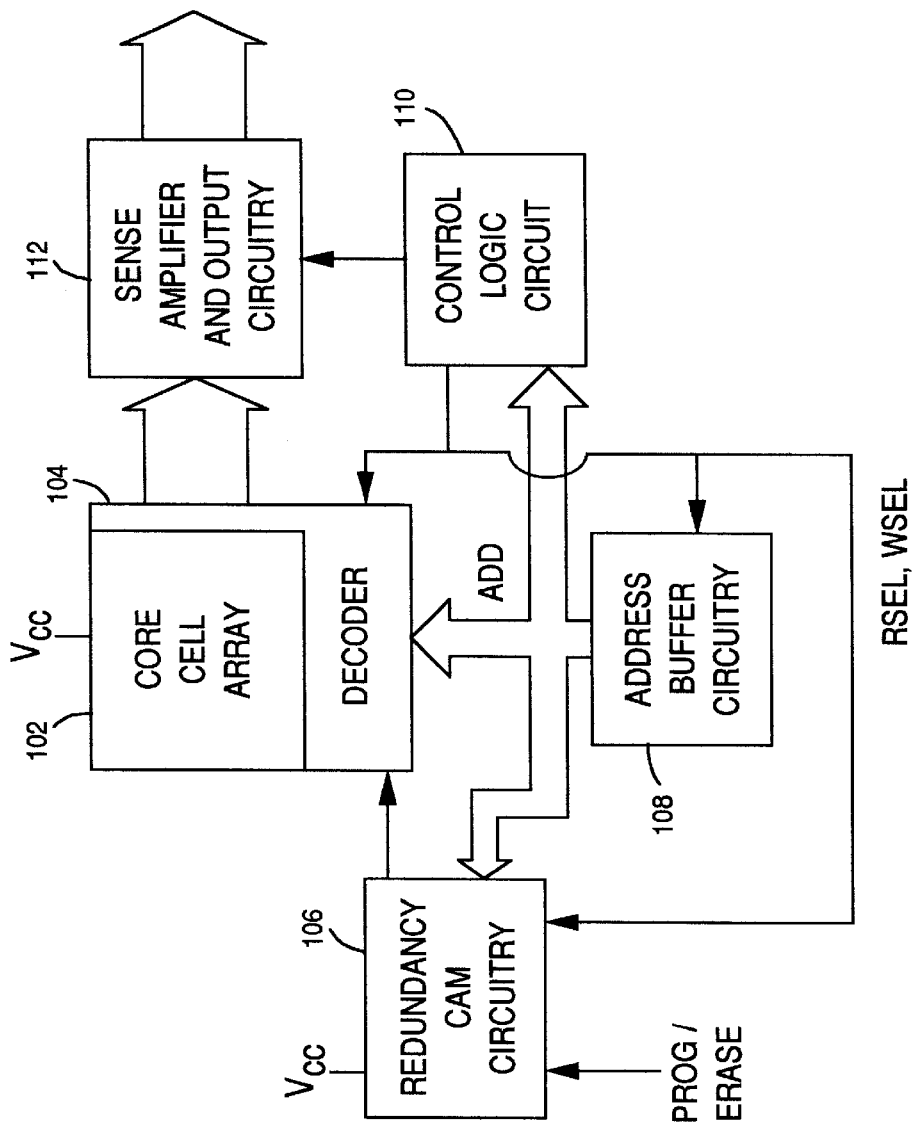
FIG. 1 is a block diagram of a memory according to a presently preferred embodiment.
Figure 2:
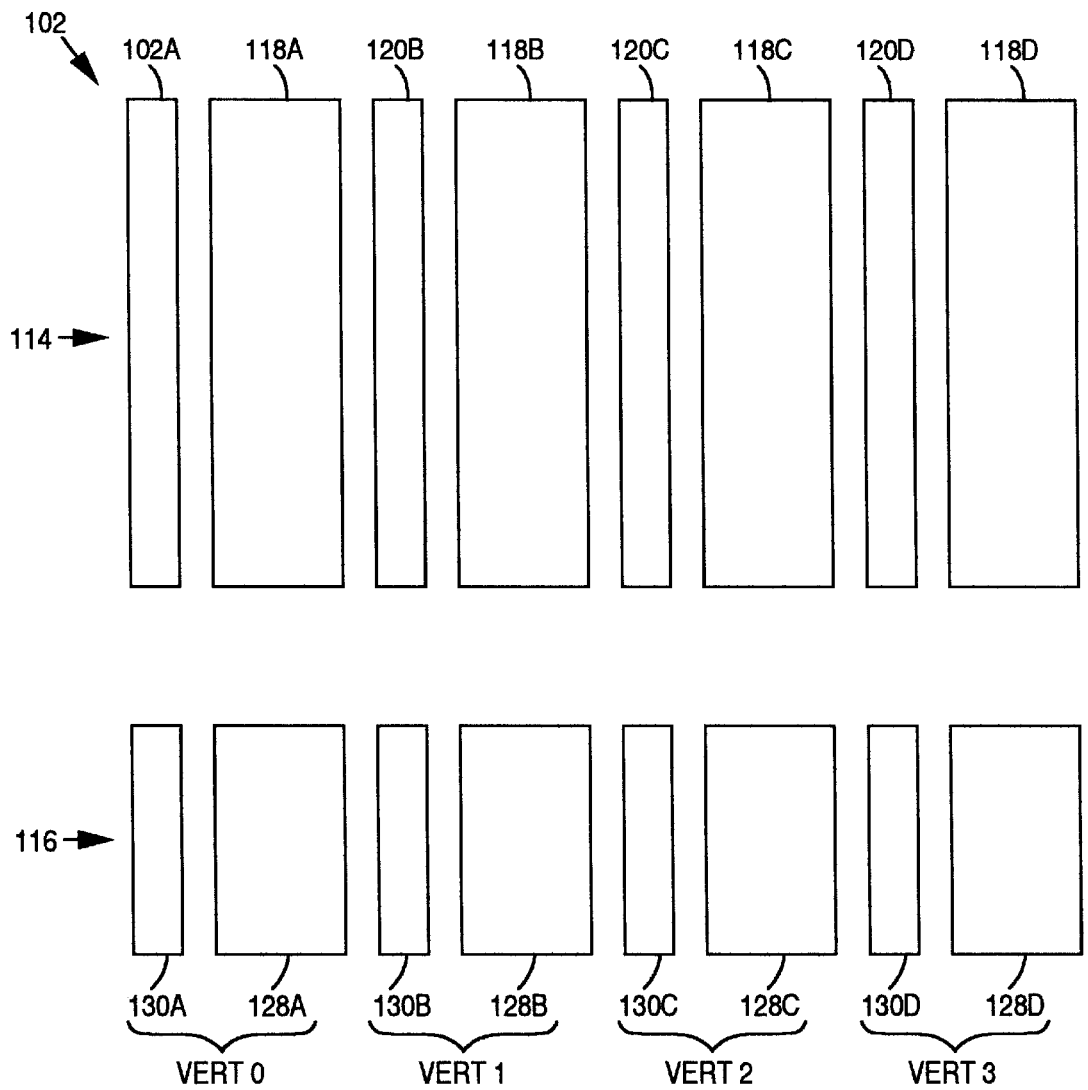
FIG. 2 is an exemplary core cell array including primary arrays and redundant arrays according to the memory of FIG. 1.
Figure 3:
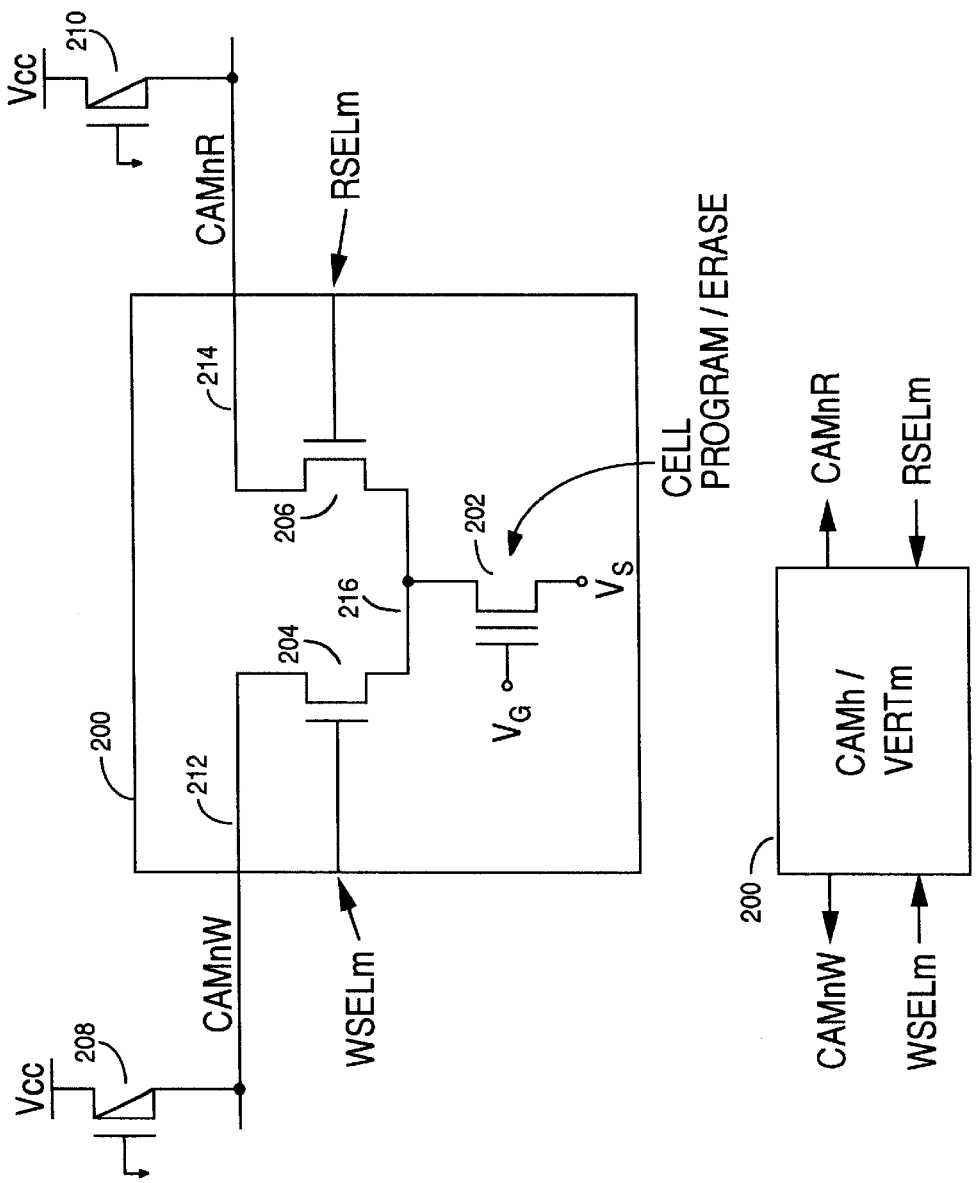
FIG. 3 is a circuit diagram of an exemplary CAM stage and accompanying output circuitry according to the memory of FIG. 1.
Figure 4:
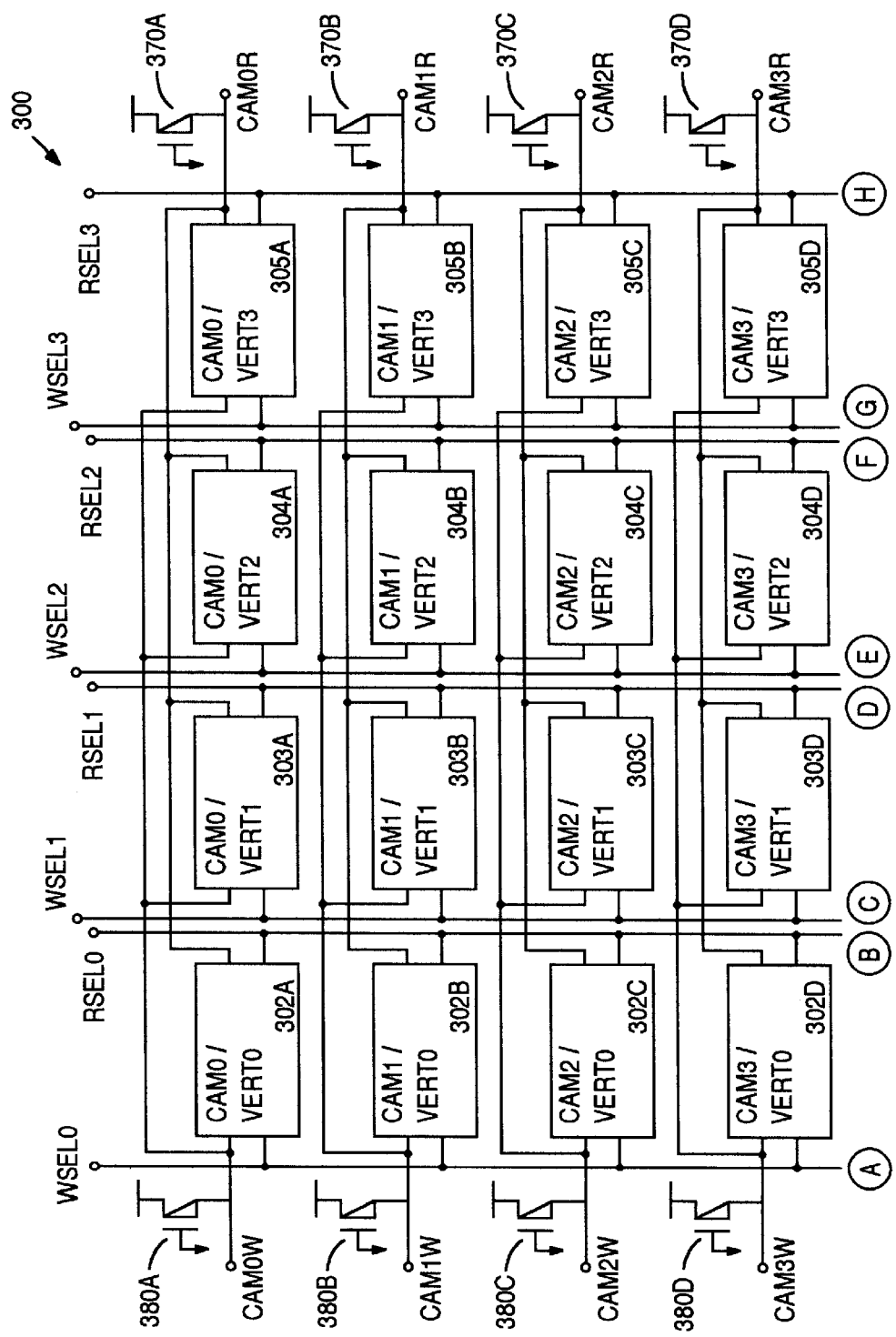
FIG. 4 is a block diagram illustrating an exemplary CAM stage array and accompanying output circuitry according to the memory of FIG. 1 and the exemplary core cell array of FIG. 2.
Figure 4:
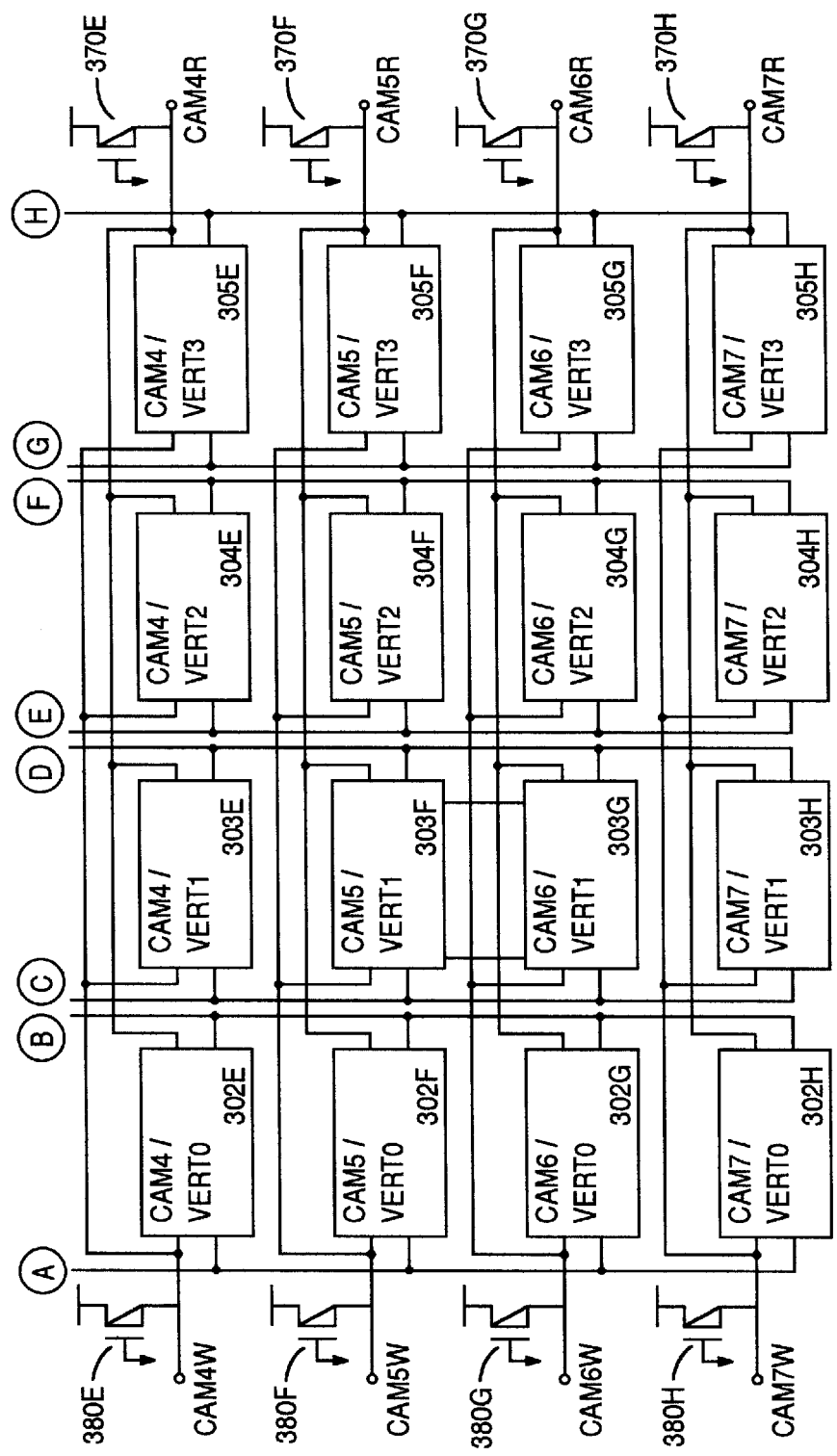
Figure 5:
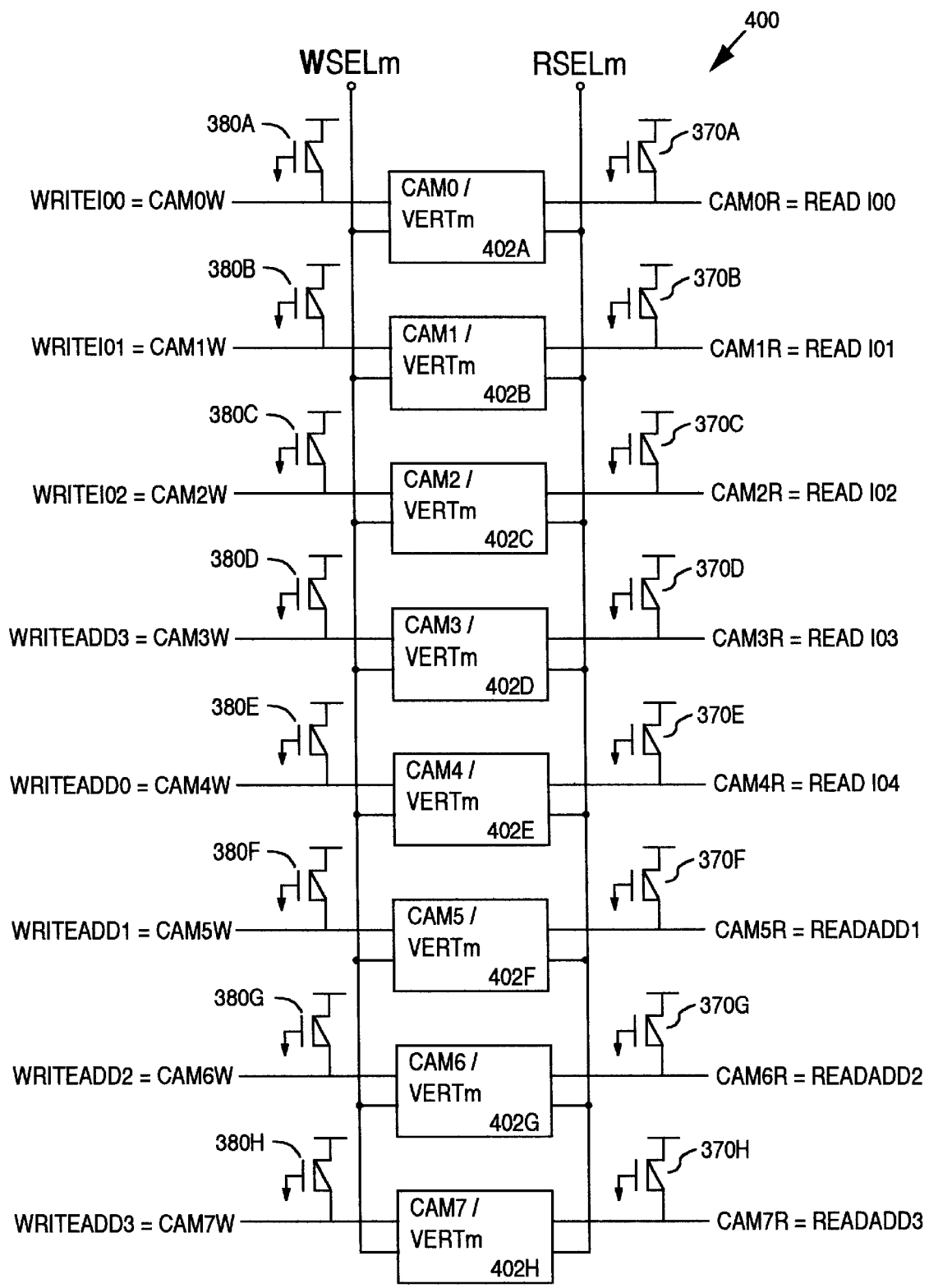
FIG. 5 is a block diagram illustrating an exemplary group of CAM stages associated with one vertical array of the exemplary core cell array of FIG. 2.

Next, after accessing, the first form of information in the CAM array 432 is processed, the address of a defective two word segment. The address of the defective two word segment is compared to, or matched with, the address of the two word segment in the primary array 412 currently being read. The comparison is completed substantially no later than the end of the reading of the regular memory cells by the regular sense amplifiers 410. In the preferred embodiment the address of the two word segment is represented by three bits, as discussed above in connection with FIG. 5. Circuitry to perform comparisons is well known to those of skill in the art and is represented in FIG. 6 by block 450.

If the two addresses are identical, or matched, the second form of information in the CAM array 432 is processed, the location of the defective memory cell or bit line within the two word segment.

As described above in connection with FIG. 5 the location within the defective two word segment of the defective memory cell or bit line is contained in five bits of one of the two CAM arrays 432. These five bits will be decoded to select one of the 32 bits of memory cells or bit lines that needs substitution by a memory cell from the redundant array. In the most preferred embodiment, this decoding 460 is a two-stage process. The first stage is a pre-decoding stage. For example, if the five bits of the CAM array describing the bit line location are described as $A_0$–$A_4$, the bit groupings ($A_0$, $A_1$), ($A_2$, $A_3$) and $A_4$ are formed. All combinations, including the complements, of ($A_0$, $A_1$) and ($A_2$, $A_3$) are arranged resulting in eight combinations. Those combinations are then applied as inputs to simple gates to produce a predecoding output. In the second stage of the decoding, those predecoding outputs are then gated with each other and with $A_4$ and $\overline{A_4}$ to produce 32 outputs representing the minterms of the five bits $A_0$–$A_4$. The processes just summarized of grouping formation, combination arrangement and application, and output gatings are well known to those of ordinary skill in the art. This decoding process is completed not substantially later than the readings by the regular sense amplifiers 410.

The 32 outputs 470 resulting from one of the two CAM arrays 432, are designated as rp0ln for the first 16 outputs and rp0hn for the second 16. Rp0In determines the defective location within the first or lower word of the two word segment while rpohn determines the defective location within the second or higher word of the two word segment. The suffix n at the end of each of these two signals designates each of the 32 outputs of the decoder 460 (after accounting for 16 suffixes for rp0l and rp0h each) and designates to which of the 16 muxtiplexer circuits the signal will be coupled, as will be discussed below. The 32 outputs resulting from the other of the two CAM arrays are designated as rp1ln for the first 16 and rp1hn for the second 16.

In the most preferred embodiment the decoding circuitry does not select any of the bits as defective and eligible for substitution if the word address comparison 450 determines that, based on both of the two redundant CAM arrays 432, the two-segment word is not defective. This null outcome of the selection process results from using a no-matching result from the comparison circuitry 450 as a disabling signal in the decoding stage 460.

Although the decoding function 460 has been described as having two stages, the first being a predecoding stage, other designs are possible as will be apparent to those of skill in the art.

At this point the circuitry has acquired 34 bits of data from the 34 sense amplifiers 410, 420. 32 bits of this 34 will eventually form the circuitry output for the two word segment. A 32-bit output multiplexer stage 490 will select the proper 32 from the 34 and will output 16 of those 32 at a time 480.

Figure 7:
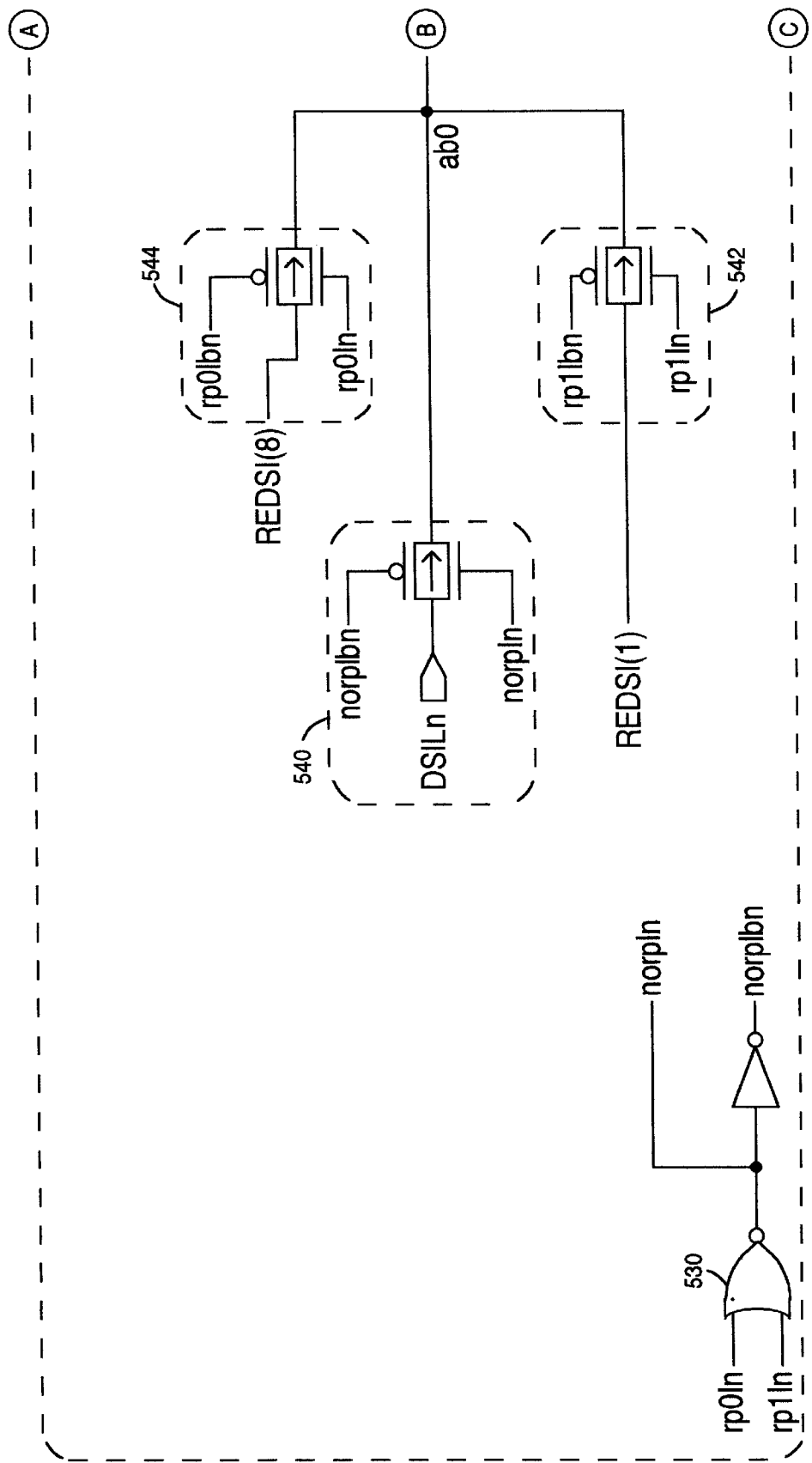
FIG. 7 is a circuit diagram of the most preferred embodiment of the multiplexing stage of the invention.
Figure 7:
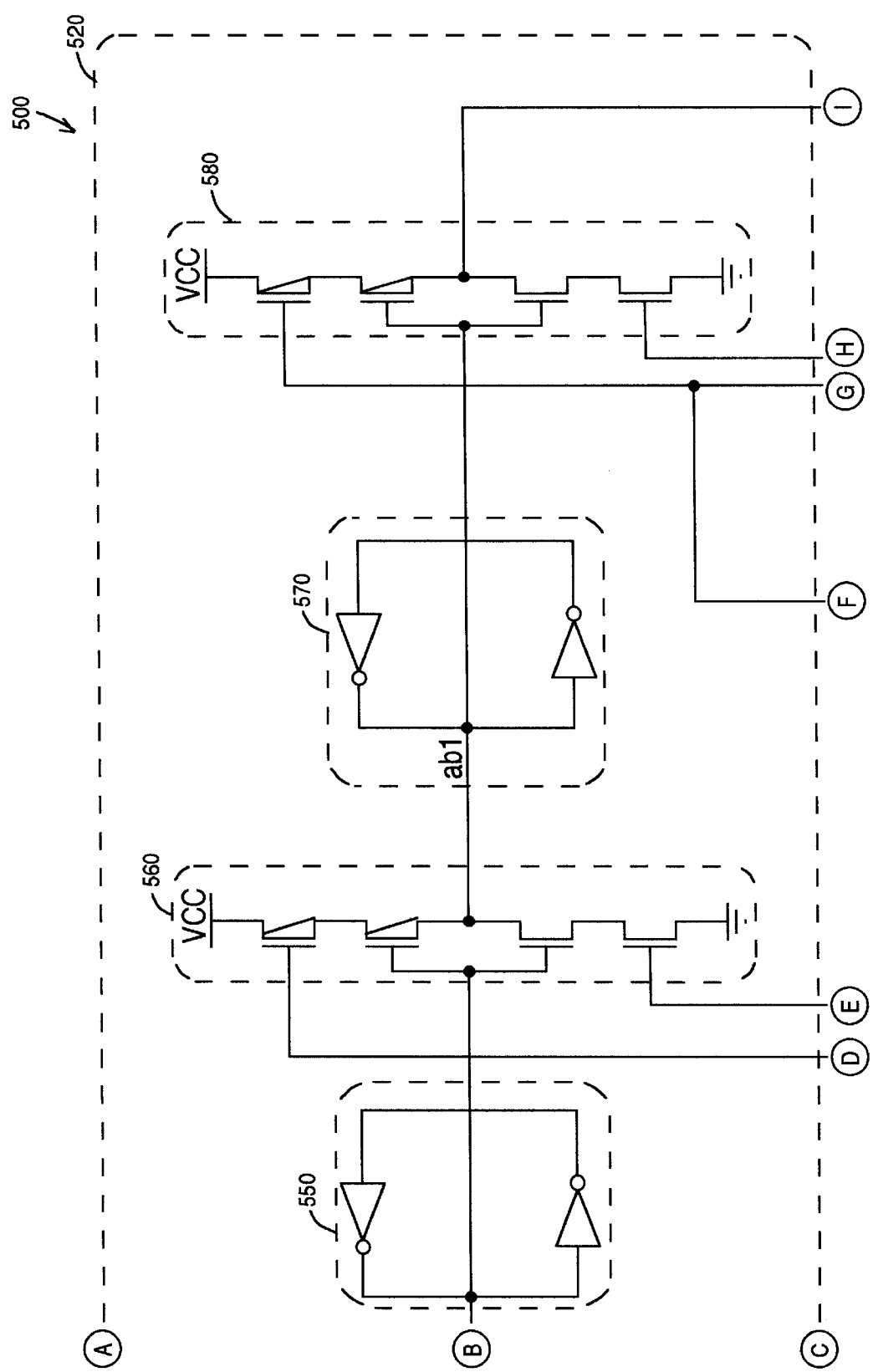
Figure 7:
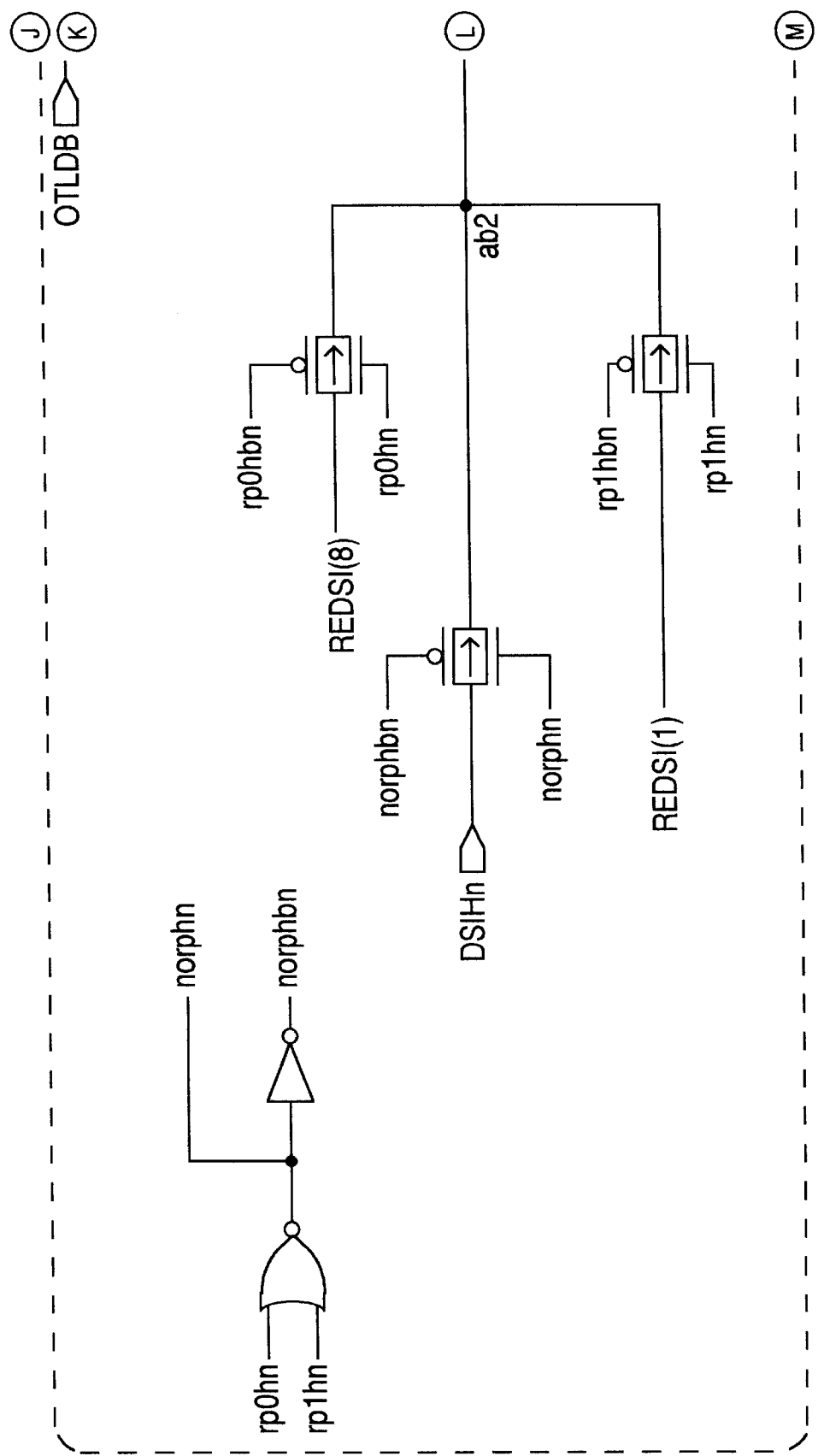
Figure 7:
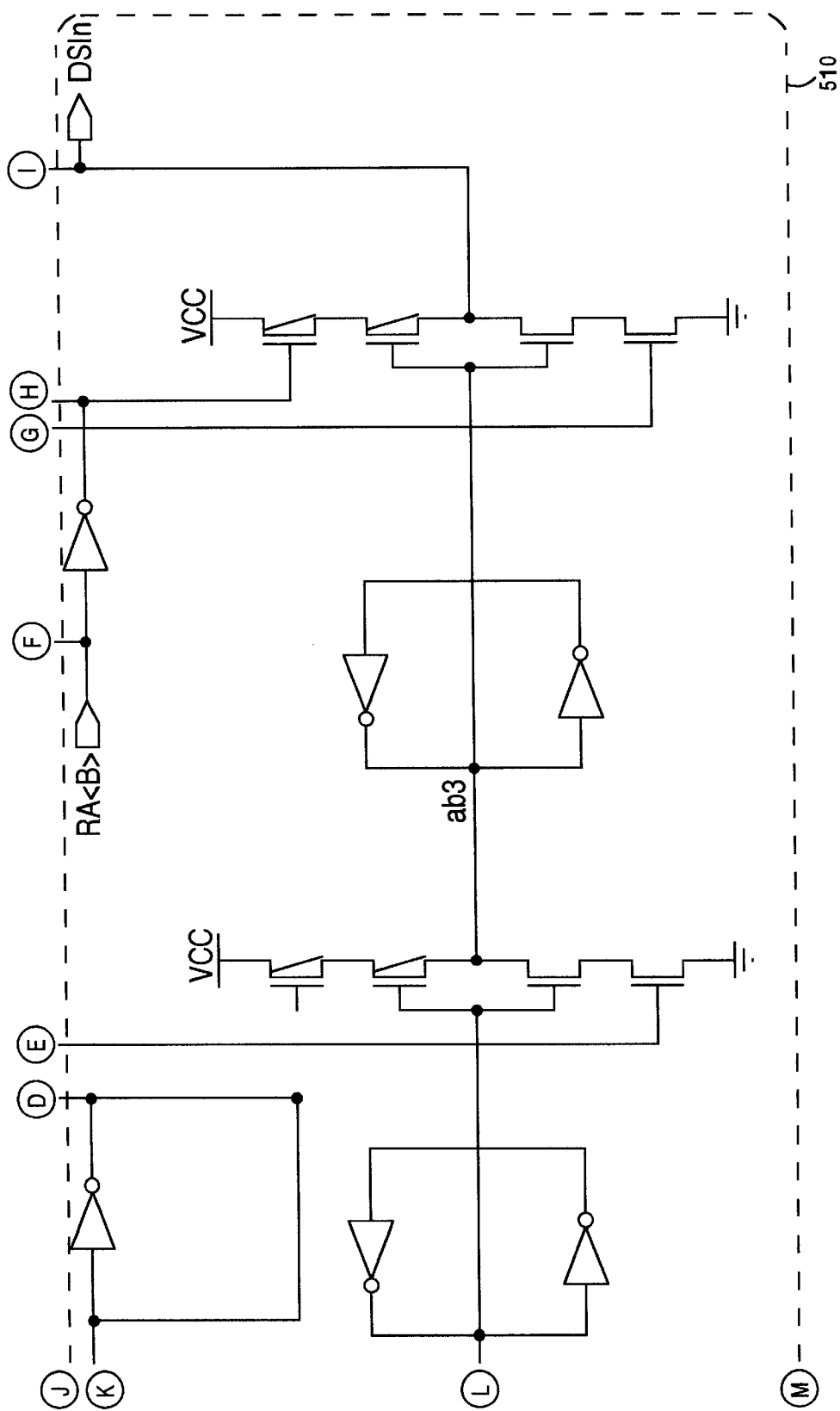

FIG. 7 depicts a portion 500 of the circuitry of the multiplexer stage 490 and can conveniently be referred to as a multiplexer circuit 500. There are 16 identical multiplexer circuits 500, represented by n=0,1, ... 15 in FIG. 7, in the multiplexer stage 490. The lower (signals marked "h") portion 510 of the multiplexer circuit (or "lower multiplexer partial circuit") operates in a manner identical to the upper (signals marked "I") portion 520, as will be apparent to one of skill in the art. Accordingly only the details of the operation of the upper portion 520 will be provided. The aggregate of the 16 identical multiplexer circuits 500 is simply referred to as the multiplexer stage 490 with a 16 bit bus output DSIn.

Data from one of the two word segments, e.g., the first, is applied at the group of 16 upper multiplexer partial circuits 520 at input DSILn (n=0, . . . , 15). As described above, the decoder 460 output is disabled and makes no selection of defect unless the two-segmented word is defective as determined by one of the two redundant CAM arrays 432. If both rp0ln and rp1In are 0 or low, norpln ("no redundance"= "nor") resulting from a NOR gate 530 is 1 or high and norpIbn, its complement, is low; accordingly, the regular array bit DSILn is passed by CMOS transmission gate 540 and then temporarily stored at latch 550.

If rp0ln is 1 or high, CMOS transmission gate 542 passes REDSI (0), the signal from the redundant sense amplifier 420 reading one of the redundant memory cells. If rp1ln is 1 or high, CMOS transmission gate 544 passes REDSI (1), the signal from the redundant sense amplifier 420 reading the other one of the redundant memory cells.

DSILn, REDSI (0) or REDSI (1), as the case may be, is then passed by transmission gate 560 controlled by DTLDB (asserted low) if the logic (not depicted) dictates that the overall circuitry perform a read. (The triangular shapes found in the upper two transistors of the transmission gate 560 denote a p-type MOSFET). Again, after storage in a latch 570, the signal passes through transmission gate 580 controlled by RA(0) which allows passage when low, i.e., RA(0) will be determined low or high by the controller depending upon whether the "L" or first portion (DSILn, the signal in the above example) or the "H" or second portion ("DSIHn") of the two segment word would be applied to the multiplexer stage output DSIn if not defective.

The foregoing detailed description has described only a few of the many forms that this invention can take. It is therefore intended that the foregoing detailed description be regarded as illustrative rather than limiting, and that it be understood that it is the following claims, including all equivalents, which are intended to define the spirit and scope of this invention.

It is therefore intended in the appended claims to cover all such changes and modifications which fall within the true spirit and scope of the invention.

What is claimed is:

1. A read redundancy assembly in a flash memory device, the assembly comprising:

an array of memory cells, the memory cells comprising a regular memory cell and a redundant memory cell;

the regular memory cell comprising a defective memory cell and non-defective memory cell, each regular memory cell having an input/output designator and a storage address;

a regular first memory cell comprising one of the regular memory cells;

a first address comprising the storage address of the regular first memory cell;

a defective first memory cell comprising one of the defective memory cells;

a defective address comprising the storage address of the defective first memory cell;

decoding circuitry configured to generate a defect decoding signal in response to the input/output designator of the defective first memory cell if said circuitry determines that the first address is the defective address, the defect decoding signal corresponding to said input/output designator;

the decoding circuitry being further configured to generate a regular decoding signal if said circuitry determines that the first address is not a defective address, the regular decoding signal corresponding to the input/output designator of the regular first memory cell;

a multiplexer stage having multiplex outputs, the multiplexer stage configured to select and apply at a multiplex first output a regular output signal in response to the regular first memory cell and in response to the regular decoding signal corresponding to the input/output designator of the regular first memory cell, the multiplex first output being the multiplex output corresponding to the input/output designator of the regular first memory cell; and the multiplexer stage being further configured to select and apply at a multiplex second output a redundant output signal in response to the redundant memory cell and in response to the defect decoding signal corresponding to the input/output designator of the defective first memory cell, the multiplex second output being the multiplex output corresponding to the input/output designator of the defective first memory cell.

2. The flash memory device according to claim 1, the flash memory device further comprising:

a regular sense amplifier configured to read the regular first memory cell;

an accessed regular first memory cell comprising the regular first memory cell read by the regular sense amplifier;

an accessed address comprising the storage address of the accessed regular first memory cell; and a redundant sense amplifier.

3. The flash memory device according to claim 2, wherein:

the regular sense amplifier is further configured to read the regular first memory cell of the accessed regular first memory cell during a first interval of time and generate during the first interval a regular signal;

the redundant sense amplifier is configured to read the redundant memory cell during a second interval of time and generate during the second interval a redundant signal, the second interval not extending substantially beyond the first interval.

4. The flash memory device according to claim 3, the flash memory device further comprising:

address matching circuitry configured to compare the accessed address with the defective address, said circuitry being further configured to generate during a third interval of time a defective address match signal if the comparison determines that the accessed address is the defective address; and the address matching circuitry being further configured to generate during the third interval a non-defective address match signal if the comparison determines that the accessed address is not a defective address, the third interval not extending substantially beyond the first interval.

5. The flash memory device according to claim 4 wherein:

the decoding circuitry is further configured to determine that the first address is the defective address in response to the defective address match signal generated by the address matching circuit, the decoding circuitry being configured to make such determination during a fourth interval of time, the fourth interval not extending substantially beyond the first interval; and the decoding circuitry is further configured to determine that the first address is not a defective address in response to the non-defective address match signal generated by the address matching circuitry, the decoding circuitry being configured to make such determination during the fourth interval of time.

6. The flash memory device according to claim 5, the flash memory device further comprising:

a first array of one or more CAM's, the first array configured to store the defective address; and a second array of one or more CAM's, the second array configured to store the input/output designator of the defective memory cell.

7. A read redundancy assembly in a flash memory device, the assembly comprising:

an array of memory cells, the memory cells comprising a regular memory cell and a redundant memory cell;

the regular memory cell comprising a defective memory cell and non-defective memory cell;

a stored word comprising a plurality of regular memory cells, each regular memory cell in a stored word having an input/output designator;

a storage address of the stored word;

a defective word comprising a stored word having a defective memory cell;

a non-defective word comprising a stored word having no defective memory cell;

a defective address comprising the storage address of the defective word;

a first array of one or more CAM's, the first array configured to store the defective address;

a second array of one or more CAM's, the second array configured to store the input/output designator of the defective memory cell;

address matching circuitry configured to compare the storage address with the defective address, said circuitry being further configured to generate a defective address match signal if the comparison determines that the storage address is the defective address;

the address matching circuitry being further configured to generate a non-defective address match signal if the comparison determines that the storage address is not a defective address;

decoding circuitry configured to generate a defect decoding signal in response to the input/output designator of the defective memory cell of the defective word having the accessed address and in response to the defective address match signal, the defect decoding signal corresponding to said input/output designator;

the decoding circuitry being further configured to generate separate regular decoding signals in response to the non-defective address match signal, the separate regular decoding signals corresponding to the separate input/output designators of the separate non-defective memory cells of the non-defective word having the accessed address;

a multiplexer stage having multiplex outputs, the multiplexer stage configured to select and apply at a multiplex first output a regular output signal in response to the regular memory cell and in response to the regular decoding signal corresponding to the input/output designator of such separate non-defective memory cell of such non-defective word, the multiplex first output being the multiplex output corresponding to the input/output designator of such separate non-defective memory cell; and the multiplexer stage being further configured to select and apply at a multiplex second output a redundant output signal in response to the redundant memory cell and in response to the defect decoding signal corresponding to the input/output designator of the defective memory cell, the multiplex second output being the multiplex output corresponding to the input/output designator of the defective memory cell.

8. A read redundancy assembly in a flash memory device, the assembly comprising:

an array of memory cells, the memory cells comprising a regular memory cell and a redundant memory cell;

the regular memory cell comprising a defective memory cell and non-defective memory cell, each regular memory cell having an input/output designator and a storage address;

a regular sense amplifier configured to read the regular memory cell;

an accessed memory cell comprising the regular memory cell read by the regular sense amplifier;

an accessed address comprising the storage address of the accessed memory cell;

a redundant sense amplifier;

a defective address comprising the storage address of the defective memory cell;

the regular sense amplifier being configured to read the accessed memory cell during a first interval of time and generate during the first interval a regular signal;

the redundant sense amplifier being configured to read the redundant memory cell during a second interval of time and generate during the second interval a redundant signal, the second interval not extending substantially beyond the first interval;

address matching circuitry configured to compare the accessed address with the defective address, said circuitry being further configured to generate during a third interval of time a defective address match signal if the comparison determines that the accessed address is the defective address;

the address matching circuitry being further configured to generate during the third interval a non-defective address match signal if the comparison determines that the accessed address is not a defective address, the third interval not extending substantially beyond the first interval;

decoding circuitry configured to generate during a fourth interval the defective memory cell having the accessed address and in response to the defective address match signal, the defect decoding signal corresponding to said input/output designator;

the decoding circuitry being further configured to generate non-defective address match signal, the separate regular decoding signals corresponding to the separate input/output designators of the separate nondefective memory cells having the accessed address, the fourth interval not extending substantially beyond the first interval;

a multiplexer stage having multiplex outputs, the multiplexer stage configured to select and apply at a multiplex first output a regular output signal in response to the regular signal and in response to the regular decoding signal corresponding to the input/output designator of such separate non-defective memory cell, the multiplex first output being the multiplex output corresponding to the input/output designator of such separate non-defective memory cell; and the multiplexer stage being further configured to select and apply at a multiplex second output a redundant output signal in response to the redundant signal and in response to the defect decoding signal corresponding to the input/output designator of the defective memory cell, the multiplex second output being the multiplex output corresponding to the input/output designator of the defective memory cell.

9. A read redundancy assembly in a flash memory device, the assembly comprising:

an array of memory cells, the memory cells comprising a regular memory cell and a redundant memory cell;

the regular memory cell comprising a defective memory cell and non-defective memory cell;

a stored word comprising a plurality of regular memory cells, each regular memory cell in a stored word having an input/output designator;

a storage address of the stored word;

a regular sense amplifier configured to read the regular memory cell of the stored word;

an accessed word comprising the stored word having the regular memory cell read by the regular sense amplifier;

an accessed address comprising the storage address of the accessed word;

a redundant sense amplifier;

a defective word comprising a stored word having a defective memory cell;

a non-defective word comprising a stored word having no defective memory cell;

a defective address comprising the storage address of the defective word;

a first array of one or more CAM's, the first array configured to store the defective address;

a second array of one or more CAM's, the second array configured to store the input/output designator of the defective memory cell;

the regular sense amplifier being configured to read the regular memory cell of the accessed word during a first interval of time and generate during the first interval a regular signal;

the redundant sense amplifier being configured to read the redundant memory cell during a second interval of time and generate during the second interval a redundant signal, the second interval not extending substantially beyond the first interval;

decoding circuitry configured to generate during a third interval of time a defect decoding signal in response to the input/output designator of the defective memory cell of the defective word having the accessed address if said circuitry determines that the accessed address is the defective address, the defect decoding signal corresponding to said input/output designator, the third interval not extending substantially beyond the first interval;

the decoding circuitry being further configured to generate during the third interval separate regular decoding signals if said circuitry determines that the accessed address is not a defective address, the separate regular decoding signals corresponding to the separate input/output designators of the separate non-defective memory cells of the non-defective word having the accessed address;

a multiplexer stage having multiplex outputs, the multiplexer stage configured to select and apply at a multiplex first output a regular output signal in response to the regular signal and in response to the regular decoding signal corresponding to the input/output designator of such separate non-defective memory cell of such non-defective word, the multiplex first output being the multiplex output corresponding to the input/output designator of such separate non-defective memory cell; and the multiplexer stage being further configured to select and apply at a multiplex second output a redundant output signal in response to the redundant signal and in response to the defect decoding signal corresponding to the input/output designator of the defective memory cell, the multiplex second output being the multiplex output corresponding to the input/output designator of the defective memory cell.

10. A read redundancy assembly in a flash memory device, the assembly comprising:

an array of memory cells, the memory cells comprising a regular memory cell and a redundant memory cell;

the regular memory cell comprising a defective memory cell and non-defective memory cell;

a stored word comprising a plurality of regular memory cells, each regular memory cell in a stored word having an input/output designator;

a storage address of the stored word;

a regular sense amplifier configured to read the regular memory cell of the stored word;

an accessed word comprising the stored word having the regular memory cell read by the regular sense amplifier;

an accessed address comprising the storage address of the accessed word;

a redundant sense amplifier;

a defective word comprising a stored word having a defective memory cell;

a non-defective word comprising a stored word having no defective memory cell;

a defective address comprising the storage address of the defective word;

a first array of one or more CAM's, the first array configured to store the defective address;

a second array of one or more CAM's, the second array configured to store the input/output designator of the defective memory cell;

the regular sense amplifier being configured to read the regular memory cell of the accessed word during a first interval of time and generate during the first interval a regular signal;

the redundant sense amplifier being configured to read the redundant memory cell during a second interval of time and generate during the second interval a redundant signal, the second interval not extending substantially beyond the first interval;

address matching circuitry configured to compare the accessed address with the defective address, said circuitry being further configured to generate during a third interval of time a defective address match signal if the comparison determines that the accessed address is the defective address;

the address matching circuitry being further configured to generate during the third interval a non-defective address match signal if the comparison determines that the accessed address is not a defective address, the third interval not extending substantially beyond the first interval;

decoding circuitry configured to generate during a fourth interval of time a defect decoding signal in response to the input/output designator of the defective memory cell of the defective word having the accessed address and in response to the defective address match signal, the defect decoding signal corresponding to said input/output designator, the fourth interval not extending substantially beyond the first interval;

the decoding circuitry being further configured to generate during the fourth interval separate regular decoding signals in response to the non-defective address match signal, the separate regular decoding signals corresponding to the separate input/output designators of the separate non-defective memory cells of the non-defective word having the accessed address;

a multiplexer stage having multiplex outputs, the multiplexer stage configured to select and apply at a multiplex first output a regular output signal in response to the regular signal and in response to the regular decoding signal corresponding to the input/output designator of such separate non-defective memory cell of such non-defective word, the multiplex first output being the multiplex output corresponding to the input/output designator of such separate non-defective memory cell; and the multiplexer stage being further configured to select and apply at a multiplex second output a redundant output signal in response to the redundant signal and in response to the defect decoding signal corresponding to the input/output designator of the defective memory cell, the multiplex second output being the multiplex output corresponding to the input/output designator of the defective memory cell.

11. A method of redundancy reading in a flash memory device, the device comprising:

an array of memory cells, the memory cells comprising a regular memory cell and a redundant memory cell;

the regular memory cell comprising a defective memory cell and non-defective memory cell;

a stored word comprising a plurality of regular memory cells, each regular memory cell in a stored word having an input/output designator;

a storage address of the stored word;

a regular sense amplifier configured to read the regular memory cell of the stored word;

an accessed word comprising the stored word having the regular memory cell read by the regular sense amplifier;

an accessed address comprising the storage address of the accessed word;

a redundant sense amplifier;

a defective word comprising a stored word having a defective memory cell;

a non-defective word comprising a stored word having no defective memory cell;

a defective address comprising the storage address of the defective word;

a first array of one or more CAM's, the first array configured to store the defective address;

a second array of one or more CAM's, the second array configured to store the input/output designator of the defective memory cell;

the method comprising the acts of:

reading with the regular sense amplifier the regular memory cell of the accessed word during a first interval of time;

generating during the first interval a regular signal in response to such reading;

reading with the redundant sense amplifier the redundant memory cell during a second interval of time;

generating during the second interval a redundant signal in response to such reading, the second interval not extending substantially beyond the first interval;

comparing during a third interval of time the accessed address with the defective address, the third interval not extending substantially beyond the first interval;

generating during the third interval of time a defective address match signal if the comparison determines that the accessed address is the defective address;

generating during the third interval a non-defective address match signal if the comparison determines that the accessed address is not a defective address;

generating during a fourth interval of time a defect decoding signal in response to the input/output designator of the defective memory cell of the defective word having the accessed address and in response to the defective address match signal, the defect decoding signal corresponding to said input/output designator, the fourth interval not extending substantially beyond the first interval;

generating during the fourth interval separate regular decoding signals in response to the non-defective address match signal, the separate regular decoding signals corresponding to the separate input/output designators of the separate non-defective memory cells of the non-defective word having the accessed address;

selecting and applying at a multiplex first output a regular output signal in response to the regular signal and in response to the regular decoding signal corresponding to the input/output designator of such separate non-defective memory cell of such non-defective word, the multiplex first output being the multiplex output corresponding to the input/output designator of such separate non-defective memory cell; and selecting and applying at a multiplex second output a redundant output signal in response to the redundant signal and in response to the defect decoding signal corresponding to the input/output designator of the defective memory cell, the multiplex second output being the multiplex output corresponding to the input/output designator of the defective memory cell.

* * * * *